US009735147B2

(12) United States Patent
Mikolajczak et al.

(10) Patent No.: US 9,735,147 B2
(45) Date of Patent: Aug. 15, 2017

(54) FAST AND STABLE ULTRA LOW DROP-OUT (LDO) VOLTAGE CLAMP DEVICE

(71) Applicant: FAIRCHILD SEMICONDUCTOR CORPORATION, San Jose, CA (US)

(72) Inventors: Adrian Mikolajczak, Los Altos, CA (US); Tirthajyoti Sarkar, Pune (IN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/855,033

(22) Filed: Sep. 15, 2015

(65) Prior Publication Data

US 2016/0079230 A1   Mar. 17, 2016

Related U.S. Application Data

(60) Provisional application No. 62/050,528, filed on Sep. 15, 2014.

(51) Int. Cl.
| | |
|---|---|
| *H01L 29/66* | (2006.01) |
| *H01L 27/02* | (2006.01) |
| *H01L 29/423* | (2006.01) |
| *H01L 29/06* | (2006.01) |
| *H01L 29/417* | (2006.01) |
| *H01L 29/78* | (2006.01) |
| *H01L 29/40* | (2006.01) |

(52) U.S. Cl.
CPC ...... *H01L 27/0285* (2013.01); *H01L 29/0688* (2013.01); *H01L 29/41741* (2013.01); *H01L 29/4236* (2013.01); *H01L 29/7828* (2013.01); *H01L 29/407* (2013.01)

(58) Field of Classification Search
None
See application file for complete search history.

(56) References Cited

U.S. PATENT DOCUMENTS

| | | |
|---|---|---|
| 3,370,219 A | 2/1968 | Hupp |
| 3,702,418 A | 11/1972 | Obenhaus |
| 4,061,962 A | 12/1977 | Stewart |
| 4,163,186 A | 7/1979 | Haley |
| 4,533,970 A | 8/1985 | Brown |
| 4,611,220 A | 9/1986 | Maciver |
| 4,652,964 A | 3/1987 | Ziegenbein |

(Continued)

FOREIGN PATENT DOCUMENTS

| | | |
|---|---|---|
| CN | 1421063 A | 5/2003 |
| CN | 101728826 A | 6/2010 |

(Continued)

OTHER PUBLICATIONS

"Failure modes of electronics", From Wikipedia, the free encyclopedia, from <http://en.wikipedia.org/wiki/Failure_modes_of_electronics>, retrieved on Dec. 20, 2010, pp. 1-20.

(Continued)

*Primary Examiner* — Shaun Campbell
(74) *Attorney, Agent, or Firm* — Brake Hughes Bellermann LLP

(57) ABSTRACT

In one general aspect, an apparatus can include a junctionless, gate-controlled voltage clamp device having a gate terminal coupled to a voltage reference device.

19 Claims, 9 Drawing Sheets

(56) References Cited

U.S. PATENT DOCUMENTS

| | | | |
|---|---|---|---|
| 4,746,960 A | 5/1988 | Valeri et al. | |
| 4,759,362 A | 7/1988 | Taniguchi | |
| 4,975,798 A | 12/1990 | Edwards et al. | |
| 5,164,874 A | 11/1992 | Okano et al. | |
| 5,274,253 A | 12/1993 | Ogawa | |
| 5,379,176 A | 1/1995 | Bacon et al. | |
| 5,539,299 A | 7/1996 | Fernandez et al. | |
| 5,581,100 A | 12/1996 | Ajit | |
| 5,723,915 A | 3/1998 | Maher et al. | |
| 5,748,422 A | 5/1998 | Heaston et al. | |
| 5,763,929 A | 6/1998 | Iwata | |
| 5,973,977 A | 10/1999 | Boyd et al. | |
| 5,998,834 A * | 12/1999 | Williams | H01L 29/7813 257/330 |
| 6,002,144 A | 12/1999 | Oishi | |
| 6,015,992 A | 1/2000 | Chatterjee et al. | |
| 6,114,672 A | 9/2000 | Iwasaki et al. | |
| 6,137,338 A | 10/2000 | Marum | |
| 6,320,275 B1 | 11/2001 | Okamoto | |
| 6,331,763 B1 | 12/2001 | Thomas et al. | |
| 6,489,879 B1 | 12/2002 | Singh et al. | |
| 6,492,792 B1 | 12/2002 | Johnson, Jr. et al. | |
| 6,521,483 B1 | 2/2003 | Hashimoto | |
| 6,700,766 B2 | 3/2004 | Sato | |
| 6,937,454 B2 | 8/2005 | Mikolajczak et al. | |
| 6,947,266 B1 | 9/2005 | Billingsley et al. | |
| 7,031,130 B2 | 4/2006 | Simonelli et al. | |
| 7,106,572 B1 | 9/2006 | Girard | |
| 7,164,185 B1 | 1/2007 | Salman et al. | |
| 7,660,096 B2 | 2/2010 | Golubovic | |
| 7,723,800 B2 | 5/2010 | Moens | |
| 7,977,742 B1 | 7/2011 | Disney | |
| 8,031,449 B2 | 10/2011 | Burns et al. | |
| 8,068,321 B2 | 11/2011 | Zhou et al. | |
| 8,115,273 B2 | 2/2012 | Moens et al. | |
| 8,125,190 B2 | 2/2012 | Odaohhara | |
| 8,861,164 B2 | 10/2014 | Mikolajczak | |
| 9,019,674 B2 | 4/2015 | Mikolajczak | |
| 9,350,175 B2 | 5/2016 | Subramaniam et al. | |
| 2002/0024791 A1 | 2/2002 | Whitney et al. | |
| 2002/0071233 A1 | 6/2002 | Bock et al. | |
| 2002/0125931 A1 | 9/2002 | Yue et al. | |
| 2003/0020133 A1 | 1/2003 | Dahlqvist et al. | |
| 2004/0085698 A1* | 5/2004 | Ball | H02H 9/001 361/100 |
| 2004/0164355 A1 | 8/2004 | Litwin et al. | |
| 2005/0057867 A1 | 3/2005 | Harris et al. | |
| 2005/0141161 A1 | 6/2005 | Usui | |
| 2005/0225421 A1 | 10/2005 | Furuta et al. | |
| 2005/0258805 A1 | 11/2005 | Thomas et al. | |
| 2005/0275065 A1 | 12/2005 | Cogan et al. | |
| 2006/0065891 A1 | 3/2006 | McCormack et al. | |
| 2006/0215342 A1 | 9/2006 | Montoya et al. | |
| 2007/0166942 A1 | 7/2007 | Cogan et al. | |
| 2008/0130180 A1 | 6/2008 | De Palma et al. | |
| 2008/0180871 A1 | 7/2008 | Hebert et al. | |
| 2008/0203517 A1 | 8/2008 | Rueb et al. | |
| 2008/0237608 A1 | 10/2008 | Richieri | |
| 2009/0212937 A1 | 8/2009 | Stamer et al. | |
| 2012/0127619 A1 | 5/2012 | Mikolajczak | |
| 2012/0170163 A1 | 7/2012 | Mikolajczak | |
| 2012/0194953 A1 | 8/2012 | Mikolajczak | |
| 2012/0200967 A1 | 8/2012 | Mikolajczak | |
| 2014/0266102 A1 | 9/2014 | Mikolajczak | |
| 2014/0268443 A1 | 9/2014 | Nassar | |
| 2014/0268462 A1 | 9/2014 | Mikolajczak | |
| 2015/0021682 A1* | 1/2015 | Bobde | H01L 29/7828 257/330 |
| 2015/0043114 A1 | 2/2015 | Sarkar et al. | |

FOREIGN PATENT DOCUMENTS

| | | |
|---|---|---|
| CN | 101872971 A | 10/2010 |
| DE | 2917256 C2 | 1/1988 |
| DE | 10146947 A1 | 4/2003 |
| EP | 2562896 A2 | 2/2013 |
| WO | 9859420 A1 | 12/1998 |
| WO | 0201644 A2 | 1/2002 |

OTHER PUBLICATIONS

"Thyristor", From Wikipedia, the free encyclopedia, available at <http://en.wikipedia.org/wiki/Thyristor>, retrieved on Dec. 20, 2010, pp. 1-8.

AN10910, "Protecting charger interfaces and typical battery charging topologies with external bypass transistors", Rev. 01—Apr. 28, 2010, Application note, Apr. 28, 2010, pp. 1-17.

EP 14000944.0, "Notification of Partial Search Report & Pay Further Search Fee (Rule 64)", Jul. 31, 2014, 7 Pages.

EP14000944.0, "Extended European Search Report Received", Jan. 14, 2015, 12 pages.

Healy, et al., "An Investigation into the Physics of Blowing Polysilicon Fuses", Report for 62nd European Study Group with Industry, Limerick, 2008, pp. 1-13.

Marak, et al., "Application Note: Tips for Enhancing ESD Protection", Littelfuse, Inc., 2009, 4 pages., 2009, pp. 1-4.

Stiles, "The Depletion NMOS Transistor—The Depletion MOSFET", The University of Kansas, Nov. 14, 2004, 3 pages., Nov. 14, 2004, 3.

* cited by examiner

FAST AND STABLE ULTRA LOW DROP-OUT (LDO) VOLTAGE CLAMP DEVICE

RELATED APPLICATION

This Application claims the benefit of and priority to U.S. Provisional Application No. 62/050,528, filed Sep. 15, 2014, which is incorporated herein by reference in its entirety.

TECHNICAL FIELD

This description relates to methods and apparatus including a voltage clamp device.

BACKGROUND

An integrated circuit (e.g., a downstream integrated circuit) can be protected from undesirable power conditions (e.g., overvoltage conditions, overcurrent condition) using a protection device. The protection device, however, may not be configured to provide protection in response to each of the various types of undesirable power conditions that can occur such as a current in-rush upon activation, a current surge, and/or so forth. Accordingly, the protection device selected for power protection may not provide adequate protection of the integrated circuit or associated components in a desirable fashion. In addition, other components included in the integrated circuit may be increased in size to compensate for the inadequacies of the protection device in response to certain types of undesirable power conditions. Thus, a need exists for systems, methods, and apparatus to address the shortfalls of present technology and to provide other new and innovative features.

SUMMARY

In one general aspect, an apparatus can include a junction-less, gate-controlled voltage clamp device having a gate terminal coupled to a voltage reference device.

The details of one or more implementations are set forth in the accompanying drawings and the description below. Other features will be apparent from the description and drawings, and from the claims.

DETAILED DESCRIPTION

Figure 1:
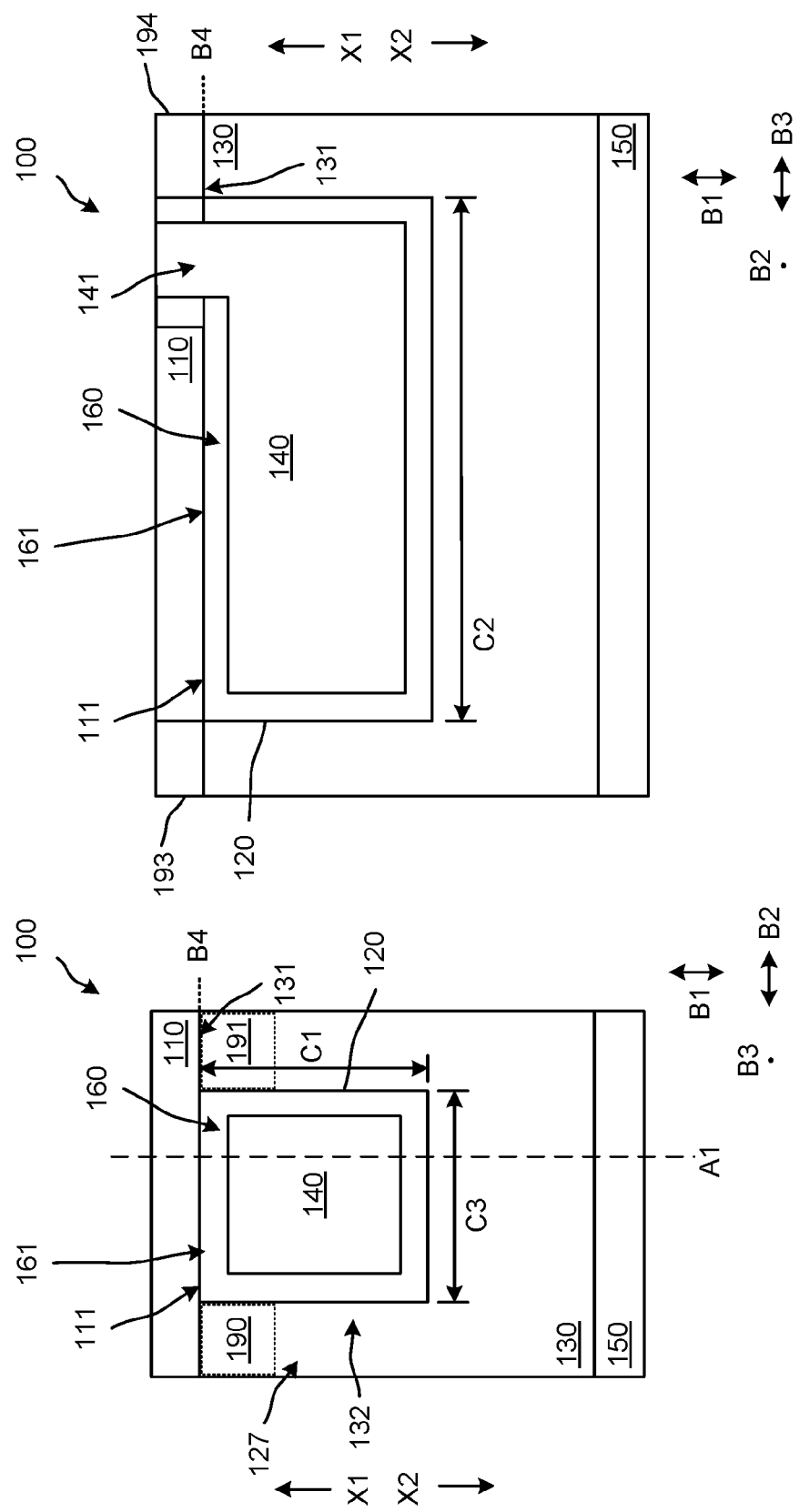
FIG. 1A is a cross-sectional view of a voltage clamp.
FIG. 1B is a cross-sectional view cut along FIG. 1A.

FIG. 1A is a cross-sectional view of a voltage clamp 100 (which can be referred to as a voltage clamp device). In some implementations, the voltage clamp 100 can be referred to as a junction-less voltage clamp. The voltage clamp 100 can be referred to as a junction-less voltage clamp, because the voltage clamp does not have, or does not, by functional necessity, include, a junction of two different conductivity type materials such as a PN junction including a P-type conductivity material and an N-type conductivity material in its primary current path (also can be referred to as a primary conduction path) (e.g., primary current path from source to drain). In other words, the voltage clamp 100 can exclude a junction of two different conductivity type materials such as a PN junction including a P-type conductivity material and an N-type conductivity material in its primary current path. In some implementations, a junction can be included in a region outside of the primary current path of the voltage clamp 100.

FIG. 1B is a cross-sectional view cut along line A1 of FIG. 1A. In this implementation, the voltage clamp 100 is a gate-controlled voltage clamp 100 where the gate is electrically isolated (within the semiconductor region) from a source or drain. More details related to gate control of the voltage clamp 100 are set forth below.

The voltage clamp 100 shown in FIGS. 1A and 1B can be considered a new type of linear regulator. The voltage clamp 100 can have effectively zero (or very little) drop out, can have nanosecond (nS) response time, and may not require an output capacitance to remain stable. Also, the voltage clamp can generate little or no noise. Many of these features are described in more detail below.

The voltage clamp 100 is configured to provide power protection to a load (not shown) from one or more undesirable power conditions. In some embodiments, the undesirable power conditions (which can include an overvoltage condition and/or an overcurrent condition) such as a voltage spike (related to power supply noise) and/or a current spike (caused by a downstream overcurrent event such as a short) may be produced by power source (not shown). For example, the load may include electronic components (e.g., sensors, transistors, microprocessors, disk drives, application-specific integrated circuits (ASICs), discrete components, circuit board) that could be damaged in an undesirable fashion by relatively fast increases in current and/or voltage produced by the power source. Accordingly, the voltage clamp 100 can be configured to detect and prevent these relatively fast increases in current and/or voltage from damaging the load and/or other components associated with the load (such as a circuit board).

Circuit designs that include a traditional low drop-out (LDO) may be slow (e.g., can require on the order of microseconds or milliseconds to respond), generate noise, and may require one or more stabilizing capacitors on the input or output. Because of their relatively slow response, traditional LDO's may not be desirable as protection devices or filters. Also, traditional LDO's typically exhibit at least a few 100 mV of dropout. Accordingly, to provide a regulated output, traditional LDO's are relatively lossy. Finally, if the input voltage is near or below the regulation voltage of traditional LDO's, they can operate in a relatively high resistance mode-making the traditional LDO's impractical for operation at or below their regulation voltage. In contrast, the voltage clamp 100 described herein has an ultra low drop out, can respond in nanosecond times, and can operate below its regulation voltage.

As shown in FIG. 1A, the voltage clamp 100 has a trench 120 disposed in (e.g., defined within) a substrate 130 (also can be referred to as a semiconductor substrate). Although not labeled, the trench 120 has a sidewall (also can be referred to as a sidewall surface) and a bottom (also can be referred to as a bottom surface). The voltage clamp 100 shown in FIG. 1A can be referred to as having a vertical trench configuration. Primary current paths are illustrated in this embodiment on the left and right sides of the trench 120.

The trench 120 includes a gate 140 disposed therein and insulated from the substrate 130 by a dielectric 160. In some implementations, the gate 140 can be referred to as a gate electrode. In some implementations, the dielectric 160 can be, for example, an oxide or another type of dielectric (e.g., a low-k dielectric). The dielectric can have portions around each side of the gate 140. The gate 140 can be a conductor that can include, for example, a material such as polysilicon.

As shown in FIG. 1A, the voltage clamp 100 includes a source conductor 110 disposed on a first side X1 (also can be referred to as side X1) of the substrate 130 and a drain conductor 150 disposed on a second side X2 (also can be referred to aside X2) of the substrate 130 opposite the first side of the substrate 130. The source conductor 110 and/or the drain conductor 150 can include a material such as a metal (e.g., multiple metal layers), polysilicon, and/or so forth. In contrast to many types of semiconductor devices, the drain conductor 150 can function as an input terminal (VIN) and the source conductor 110 can function as an output terminal (or VOUT). Accordingly, the direction of typical current flow can be from the drain conductor 150 to the source conductor 110.

The gate 140 is electrically isolated or insulated from the source conductor 110 and the drain conductor 150. In this embodiment, the gate 140 can be coupled to (e.g., physically coupled to, electrically coupled to) a contact (e.g., an external contact, a gate terminal) via an extension 141 shown in FIG. 1B. Accordingly, the gate 140 can be independently controlled related to the source conductor 110 and the drain conductor 150.

The extension 141 in this embodiment is disposed at an end of the gate 140 and at an end of the trench 120. In some implementations, the extension 141 can be located a different lateral location (e.g., a middle portion) along the trench 120 and/or the gate 140.

The source conductor 110, portions of the dielectric 160, a portion of the substrate 130, and the drain conductor 150 are stacked along the line A1 (along direction B1) (also can be referred to as a vertical direction). The source conductor 110, portions of the dielectric 160, the portion of the substrate 130, and the drain conductor 150 can be referred to as being included in a vertical stack.

The voltage clamp 100 shown in FIGS. 1A and 1B is configured as an ultra-low drop-out (LDO) regulator. The voltage clamp 100 is configured to limit a current between the source conductor 110 and the drain conductor 150 in response to a relatively low voltage difference (e.g., low limit initiating voltage) between the source conductor 110 and the gate 140 (i.e., VGS). The limit initiating voltage can be a voltage at which current limiting is initiated by the voltage clamp 100. For example, the voltage difference to turn off the voltage clamp 100 can be less than or equal to 0.6 V. The low turn off the voltage clamp 100 can be, at least in part, due to very little or no overhead voltage required to operate the voltage clamp 100 or to keep the voltage clamp 100 in a regulating state. The voltage clamp 100 can be referred to as a zero drop-out (zDO) regulator. In some implementations, for example, a 90 milli-ohm (mΩ) voltage clamp 100 at 100 milli-amperes (mA) can have a drop out voltage less than 10 milli-volts (mV). The voltage clamp 100, as configured herein, can manage (or limit) both current spike and/or voltage spikes. The voltage clamp 100 is configured to at least: (1) regulate an output voltage (e.g., an output voltage at the source conductor 110) within a relatively tight range in response to changes in input voltage, and (2) regulate an output voltage within a relatively tight range in response to changes in current across a load (not shown). Such regulation of the output voltage can be achieved by modifying a current limit value (e.g., current-limiting capability) or resistance (e.g., channel resistance) of the voltage clamp 100. The current limit value or resistance can be controlled by the voltage between the gate 140 and the source conductor 110 (i.e., a gate-to-source voltage (VGS)). In some implementations, the current limit value of the voltage clamp 100 can be decreased or increased in response to a change in VGS.

In some implementations, a voltage reference device (which is described in more detail below) can be used in conjunction with (e.g., applied to the gate electrode 140 of) the voltage clamp 100. As an output voltage of the voltage clamp 100 increases above a reference voltage produced by a voltage reference device (e.g., as VGS increases (i.e., because a larger negative value (e.g., increases in absolute value))), the current limit of the voltage clamp 100 decreases (and vice versa). The accuracy of the voltage clamp 100 (or VOUT tolerance) may be a function of a voltage required to change from a non-current-limiting state to a current limiting state. The speed of the voltage clamp 100 can be correlated to how quickly the current limiting of the voltage clamp 100 can be changed. This type of feed-forward design associated with the voltage clamp can eliminate oscillations. In some implementations, the gate voltage is fixed, and it may be the output voltage variation relative to the gate that generates a near instantaneous variation in current limit and channel resistance which, in turn, maintains the output voltage within a key tolerance band. This may be contrasted to a traditional LDO feedback loop where a comparator may be used to measure output voltage, and its hysteresis, its response time, and other circuit parasitics can result in system oscillation.

Each of the source conductor 110, the substrate 130, the drain conductor 150, and so forth are aligned along a direction B2 (also can be referred to as a horizontal direction or as a lateral direction), which is substantially orthogonal to the direction B1. The direction B2 is aligned along or parallel to a plane B4, along which the source conductor 110, the substrate 130, the drain conductor 150, and so forth are also aligned. In FIG. 1A, a top surface 131 of the substrate 130 and a bottom surface 111 of the source conductor 110 are aligned along plane B4. In some implementations, a portion of the voltage clamp 100 proximate the source conductor 110, or a direction away from the drain conductor 150 (substantially along the direction B1), can be referred to as top portion or an upward direction. In some implementations, a portion of the voltage clamp 100 proximate the drain conductor 150, or a direction toward the drain conductor 150 (substantially along the direction B1), can be referred to as bottom portion or a downward direction.

A direction B3 into the page (shown as a dot) is aligned along or parallel to the plane B4 and is orthogonal to directions B1 and B2. In the implementations described herein, the vertical direction is normal to a plane along which the substrate 130 is aligned (e.g., the plane B4). The directions B1, B2, and B3, and plane B4, are used throughout the various views of the implementations described throughout the figures for simplicity. Each of the directions can also be referred to as an axis.

The trench 120 has a depth C1 aligned along the direction B1 (or axis), a length C2 (shown in FIG. 1B) aligned along the direction B3 (also can be referred to as a longitudinal axis), and a width C3 aligned along the direction B2 (also can be referred to as a horizontal axis). The aspect ratio of the trench 120 is defined so that the length C2 is greater than the width C3 of the trench 120. Also, the trench 120 can generally be referred to as being aligned along the direction B1 or can be referred to as having a depth along the direction B1.

As mentioned above, the voltage clamp 100 is a junction-less device. Accordingly, the substrate 130 can have a portion (on a right side or left side (e.g., a space charge region 132) of the trench 120) aligned along direction B1 (e.g., vertically aligned along direction B1) and adjacent the trench 120 that has a conductivity type that is continuous along an entirety (or substantially along an entirety (except for areas doped to provide an Ohmic contact and/or source regions)) of the depth C1 of the trench 120. In other words, the substrate 130 has a portion that is a single conductivity type along the entirety of the depth C1 of the trench 120.

Because the voltage clamp 100 does not have a junction, the current limiting functionality of the voltage clamp 100 can have an increase/decrease in current limit (e.g., saturation current) and increase/decrease in resistance (e.g., on-resistance, off resistance) with changes in temperature resulting in a thermally self-balanced device (which can be a result of a positive temperature coefficient of resistance) that can better support parallel device implementations. This is contrasted with a device including a junction.

In some implementations, the space charge region 132 can be referred to as a region or substrate region. A space charge region on the right side of the trench 120 is not labeled in FIG. 1A. The space charge region 132 is included in a primary conduction path and a majority (substantially an entirety) of the space charge region 132 is a material of a single conductivity type. An area (substantially an entire area) between the space charge region 132 and the drain conductor 150 is the same conductivity type as the space charge region 132. The area between the space charge region 132 and the drain conductor 150 can be a drift region and can be considered part of the primary conduction path.

The features of the voltage clamp 100 are mirrored. For example, the space charge region 132 on the left side of the voltage clamp 100 shown in FIG. 1A are mirrored on the right side of the voltage clamp 100. The space charge region 132 can be disposed within, or can define, a mesa 127 between the trench 120 and another trench (not shown) of the voltage clamp 100. Because the voltage clamp 100 is a junction-less device, the space charge region 132 (or mesa 127) excludes a body region (e.g., a P-type body region).

As shown in FIGS. 1A and 1B, the substrate 130 has a single conductivity type (e.g., an N-type conductivity, a P-type conductivity) that is continuous between the source conductor 110 and the drain conductor 150. In other words, the substrate 130 can have a continuous conductivity type between the source conductor 110 and the drain conductor 150. In some implementations, the substrate 130 can have a single conductivity type that is continuous, but varies along the direction B1. For example, the substrate 130 can include multiple epitaxial layers that have different doping concentrations, but are of the same conductivity type. As another example, the substrate 130 can have a doping concentration (e.g., a graded doping concentration) that decreases along direction B1, or increases along direction B1.

As shown in FIG. 1A, a source region 190 can be included in the space charge region 132. Another source region 191 is included in a space charge region on a side of the trench 120 opposite the space charge region 132. In some implementations, the source region 190 can extend to a depth within the substrate 130 below a top surface of the gate 140. The source region 190 can be doped such that a contact between the source conductor 110 and the source region 190 is Ohmic.

Said differently, the space charge region 132 can have a single conductivity type (along a primary conduction path) that is continuous between the source conductor 110 (and source region 190, 191) and the drain conductor 150. The primary conduction path, in some implementations, can exclude the source regions 190, 191 (which can be relatively shallow and extend to only a small fraction (e.g., less than one third) of the depth of the gate 140). The source conductor 110 is disposed on side X1 of the substrate 130 and the drain conductor 150 is disposed on side X2 of the substrate 130 opposite side X1 of the substrate 130. The portion of the substrate (which can include the space charge region 132) can have a conductivity type (e.g., single conductivity type) extending between the source conductor 110 and the drain conductor 150.

The voltage clamp 100 shown in FIGS. 1A and 1B can be configured as a default "on" device (e.g., a biased on device, or normally-on device). In other words, the voltage clamp 100 is configured to be in an on-state or relatively low resistance state, when gate and source voltage are equal. The channel will turn off (or achieve a relatively high resistance state) in response to a specified voltage difference being applied between the source conductor 110, the gate 140, and/or the drain conductor 150. For example, the voltage clamp 100 can be on when a difference between the source conductor 110 and the gate 140 is zero (e.g., VGS=0) Specifically, current can be permitted to flow between the source conductor 110 and the drain conductor 150 through, for example, the space charge region 132.

In some implementations, when a gate voltage (VG) is above a source voltage (V) of the voltage clamp 100, a knee of an I-V curve (representing the responsiveness of the voltage clamp 100) may moves up or down in response to gate-to-source voltage (VGS). For example, at VGS=0 a current limit may be approximately 1 A, at VGS=−0.5 the current limit may be approximately 0.001 A, and at VGS=+5 the current limit may be approximately 100 A. Accordingly, current limit can be reduced as VGS becomes more negative. Current limit can increases as VGS approaches zero, and can continue to increase as VGS>0.

The voltage clamp 100 is configured to change from a non-limiting, relatively current independent resistance, on-state (e.g., normally-on state (e.g., biased on) or normally conducting without current limiting) to a variable resistive state or current-limiting state in response to the magnitude of current though the primary conduction path, and the relative voltage of gate to source. The current limiting level can be controlled by a difference between a potential (also can be referred to as a voltage) existing at the source conductor 110 and a potential applied to the gate 140. As a specific example, the voltage clamp 100 is configured to reduce the magnitude of the current limit through voltage clamp 100 when a potential achieved at the source conductor 110 is higher than a potential applied to (or at) the gate 140. In other words, the voltage clamp 100 varies the amount of current it will pass (change its current limit set point) in response to variation in potential achieved or applied between the source conductor 110 and the gate 140. In response to the difference in potential, an electrical field (which can be associated with one or more depletion regions) is formed in the space charge region 132 (also can be referred to as channel region) and the electrical field can limit current flowing through the space charge region 132. In some implementations, as a potential applied to the gate 140 approaches (but is above) a potential applied to the source conductor 110, the current limit decreases. In some implementations, when the potential applied to the gate 140 is equal to a potential applied to the source conductor 110, the voltage clamp 100 can have a non-zero current limit.

Because the current limit of the voltage clamp 100 is based on a voltage difference and related electric fields, the voltage clamp 100 can limit current relatively fast (e.g., instantaneously) compared with other types of devices. The speed with which the voltage clamp 100 starts to limit current can be referred to as a response time. In some implementations, the response time can be less than 1 microsecond (e.g., 1 nanosecond (ns), less than 10 ns). For example, the voltage clamp 100 can be configured to limit current significantly faster than a thermally-based device can limit current in response to changes in temperature. The junction-less primary conduction paths of the voltage clamps (e.g., voltage clamp 100) described herein can generate Schottky-like response times.

Also, because the voltage clamp 100 is configured to limit current in response to a voltage difference, the voltage clamp 100 can continue to respond to changes in voltage and limit current after the temperature of a system has increased to, for example, a relatively high temperature that would otherwise render a thermally-based device ineffective or inoperable. In other words, the voltage clamp 100 can have a substantially constant functionality in response to changes in temperature. Said differently, the voltage clamp 100 can operate independent of (or substantially independent of) changes in temperature. In some implementations, a saturation current of the voltage clamp 100 can be substantially constant with changes in temperature. In some implementations, a change in space charge region resistance of the voltage clamp 100 between the non-current-limiting state and current-limiting state can be greater than 5 times (e.g., greater than 10 times) with changes in temperature.

In some implementations, the gate 140 disposed within the trench 120 can be coupled to other electrodes in parallel trenches (aligned along direction B3) via one or more conductors disposed in one or more perpendicular trenches aligned along direction B2. In other words, several parallel trenches (including trench 120), which are aligned along a first direction (e.g., direction B3), can include electrodes (e.g., gate 140) that are shorted by a conductor (e.g., an electrode) disposed in perpendicular trench orthogonally aligned along a second direction (e.g., direction B2) relative to the parallel trenches.

In this voltage clamp 100 the conductivity type of the substrate 130 (and space charge region 132) can have, for example, a conductivity type and the gate 140 can have the same conductivity type. In this voltage clamp 100 the conductivity type of the substrate 130 (and space charge region 132) can have, for example, a first conductivity type and the gate 140 can have the second conductivity type opposite the first conductivity type. For example, the substrate 130 (and space charge region 132) can have a P-type conductivity and the gate 140 can have an N-type conductivity.

In some implementations, the lateral field effect or electrical field defined within the space charge region 132 can be defined by the work function of the gate 140. In some implementations, the work function of the gate 140 can be defined by a material of the gate 140 and/or a doping level (e.g., dopant concentration) of a dopant included in the gate 140. In some implementations, the gate 140 can be a polysilicon material doped with, for example, Boron or Phosphorus.

In some implementations, the gate 140 can have a P-type conductivity. The gate 140 can have a P-type conductivity (and work function) that facilitates or enables normally-on operation. In some implementations, a doping level of a dopant included in the gate 140 can have a doping level or concentration to define the saturation current (e.g., current limit) of the voltage clamp 100 at a specific value.

In contrast with the voltage clamp 100 described herein, N-type dopant of an electrode in a MOSFET device can be critical to enable a desirable limit initiating voltage and to minimize gate resistance and gate capacitance. Although N-type dopant of the gate 140 of the voltage clamp 100 may minimize gate resistance and gate capacitance, P-type dopant in the gate 140 can enable normally-on operation in a desirable fashion. Specifically, a suitable level of P-type dopant in the gate 140 can enable a relatively wide range of saturation current (e.g., current limit) control without changing (e.g., keeping relatively constant) other voltage clamp 100 device design parameters.

In some implementations, the dielectric 160 (and portions thereof such as dielectric portion 160A, 160B, and 160C) can be implemented to allow for reverse current operation without undesirable breakdown. An ACCUFET device, for example, in contrast with the voltage clamp 100, is normally-off when gate-to-source voltage is equal to zero. Thus, a reverse current in an ACCUFET device (which would require a high gate voltage is impossible to achieve in many scenarios and/or impractical in operation within applications.

The voltage clamp 100 can have a variety of characteristics and specification. For example, the voltage clamp 100 can have voltage limiting capability is greater than 100 V (e.g., 200 V, 350 V, 500 V). In some implementations, the voltage clamp 100 can have an operating series resistance less than 1 ohm ($\Omega$) (e.g., 500 m$\Omega$, 200 m$\Omega$). In some implementations, the voltage clamp 100 can have a surge response resistance greater than 20$\Omega$ (e.g., 30$\Omega$, 50$\Omega$, 100$\Omega$). In some implementations, the voltage clamp 100 can be configured to limit to several amperes at a voltage of more than a 100 V (e.g., limit to 1 A at 300 V, limit to 5 A at 220 V, limit to 3 A at 100 V). In some implementations, the response time (e.g., response time to current surges, response time to change from a conducting state to a current-limiting state) can be less than 1 microsecond (e.g., 1 ns, less than 10 ns). In some implementations, the voltage clamp 100 can be packaged for surface mounting or can be packaged with leads.

As mentioned previously, the voltage clamp 100 can have a relatively fast response time. For example, the voltage clamp 100 can have a response time less than 100 ns. The response time can be a time to change from a non-current-limiting state to a current-limiting state. Because the voltage clamp 100 can have a relatively fast response time, the voltage clamp 100 can be used in a variety of applications.

In some implementations, the substrate 130 can be a semiconductor region that include one or more epitaxial layers stacked on (e.g., grown on) a substrate. In some implementations, the substrate and/or epitaxial layer(s) can include, but may not limited to, for example, Silicon (Si), Galium Arsenide (GaAs), Silicon Carbide (SiC), and/or so forth. In some implementations, the substrate 130 can have a doping that varies along direction B1 (e.g., a relatively low dopant concentration in the mesa region and a relatively high dopant concentration in a region below the trench 120).

Although not shown in FIGS. 1A and 1B, the voltage clamp 100 can include multiple trenches. In other words, the structures illustrated in FIGS. 1A and 1B can be duplicated (e.g., repeated) within the substrate 130. Specifically, the trench 120, and features related thereto, can be duplicated within the substrate 130.

Although not shown in FIGS. 1A and 1B, the voltage clamp 100 can be integrated (e.g., monolithically integrated) with other types of devices such as vertical MOSFET devices (not shown). In such implementations, the voltage clamp 100 can be electrically isolated from other such semiconductor devices using, for example, a junction isolation, a trench isolation, an implant isolation, and/or so forth.

Figure 2:
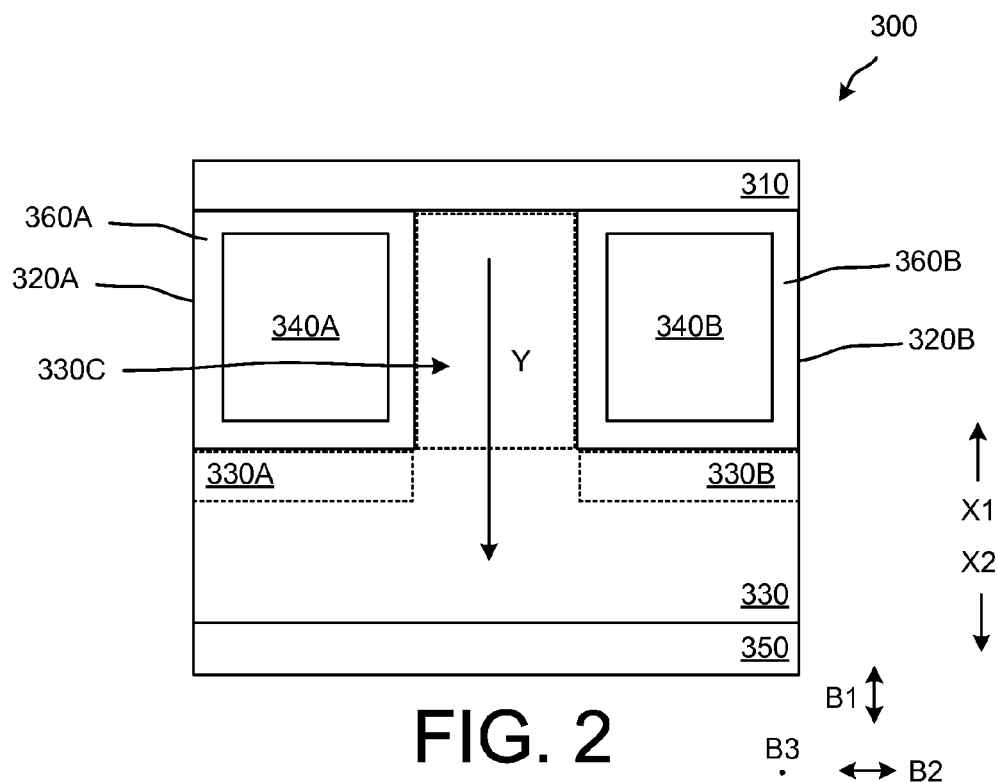
FIGS. 2 and 3 are diagrams that illustrate another voltage clamp according to an implementation.
Figure 3:
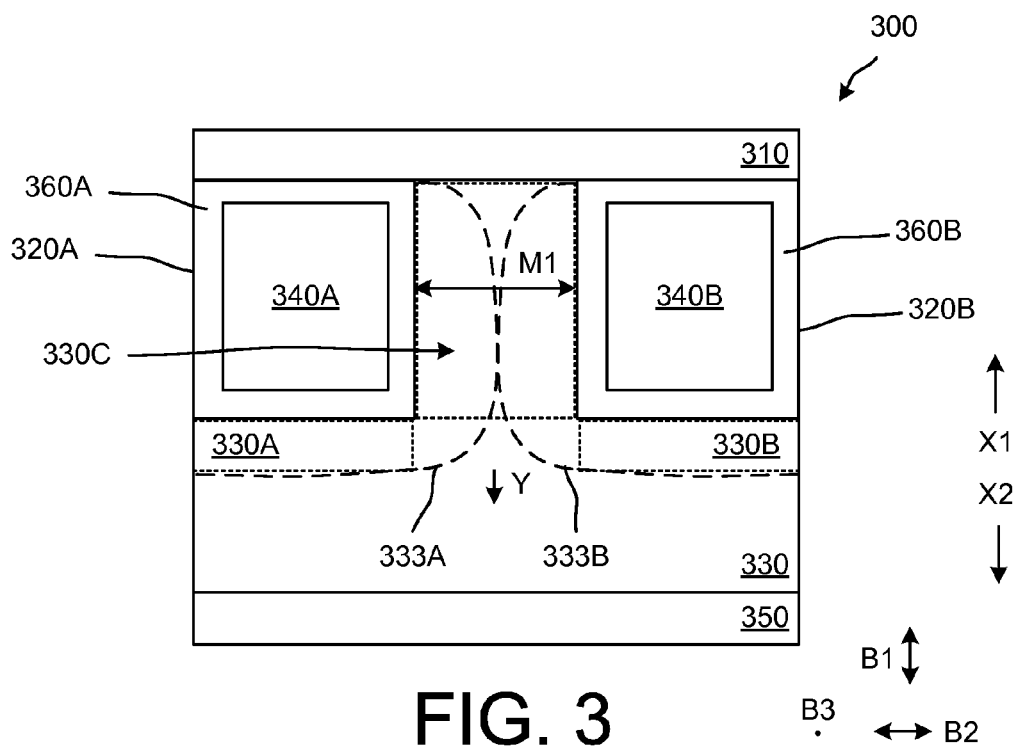

FIGS. 2 and 3 are diagrams that illustrate another voltage clamp 300 according to an implementation. FIG. 2 illustrates the voltage clamp 300 when in a non-current limiting state or conducting state, and FIG. 3 illustrates the voltage clamp 300 when in a current limiting state or resistive state.

FIGS. 2 and 3 illustrate portions of a space charge region including space charge region portions 330A, 330B, and 330C. The space charge region portions 330A, 330B, and 330C are illustrated with rectangular dashed lines for simplicity. In some implementations, one or more of the space charge region portions 330A, 330B, and 330C can have different dimensions and/or shapes.

Gate 340A is disposed within trench 320A and insulated by dielectric 360B, and gate 340B is disposed within trench 320B and insulated by dielectric 360B. The voltage clamp 300 has a source conductor 310 and a drain conductor 350. The trenches 320A, 320B are formed within a substrate 330. The characteristics and operation of the voltage clamp 300 can be similar to, or the same as, the operation of the voltage clamp 100 described in connection with, for example, FIGS. 1A and 1B.

Referring specifically to FIG. 2, a current Y is permitted to flow between the source conductor 310 and the drain conductor 350 through the space charge region portion 330C when a voltage drop between the gates 340A, 340B and the source conductor 310 is approximately 0 (and a voltage drop between source conductor 310 and the drain conductor 350 is greater than 0).

As shown in FIG. 3, the current Y is limited between the source conductor 310 and the drain conductor 350 through the space charge region 330C by depletion regions 333A and 333B (each illustrated with curved dashed lines) in proportion to the voltage drop between the gate 340A, 340B and the source conductor 310 (e.g., source potential>gate potential can increase the depletion region and reduce the magnitude of total current that passes through the device).

As shown in FIG. 3B, the depletion region 333A is formed in at least the space charge region portion 330C and in space charge region portion 330A below (e.g., vertically below) the trench 320A. Similarly, the depletion region 333B is formed in the space charge region 330C and in the space charge region portion 330B below (e.g., vertically below) the trench 320B.

Figure 4:
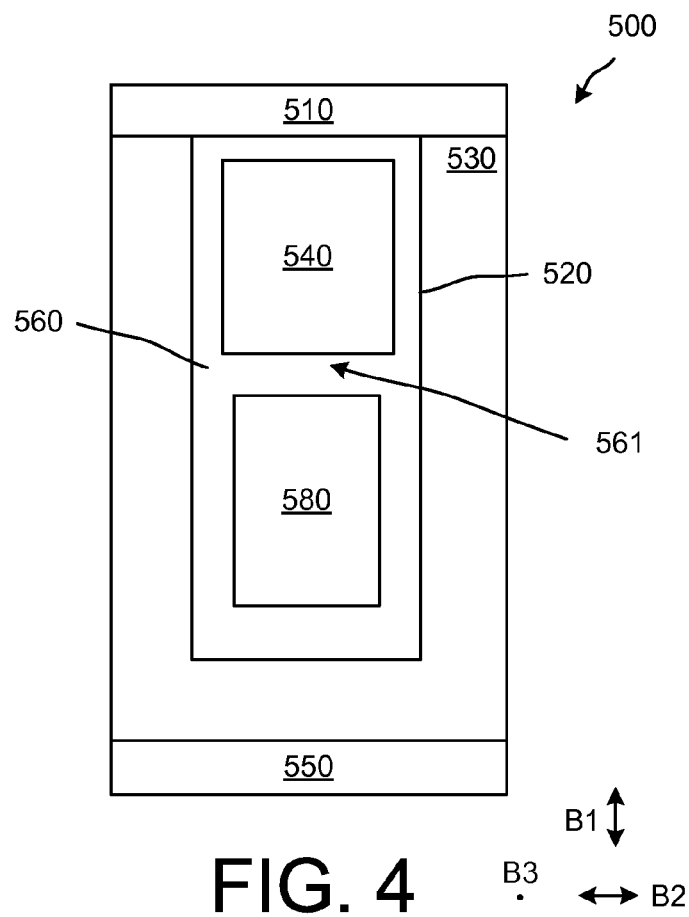
FIG. 4 illustrates another voltage clamp according to an implementation.

FIG. 4 illustrates another voltage clamp 500 according to an implementation. As shown in FIG. 4, the voltage clamp 500 includes an electrode 540 and a shield electrode 580 disposed within a trench 520. In some implementations, the electrode 540 can be referred to as a gate electrode. The electrode 540 and the shield electrode 580 are insulated from the substrate 530 by a dielectric 560. The shield electrode 580 can be insulated from the electrode 540 by an inter-electrode dielectric 561, which can be considered a portion of the dielectric 560. In some implementations, the inter-electrode dielectric 561 can be deposited separate (e.g., using a separate process) from dielectric 560. The voltage clamp 500 has a source conductor 510 and a drain conductor 550.

The characteristics and operation of the voltage clamp 500 can be similar to, or the same as, the operation of the voltage clamp 100 described in connection with, for example, FIGS. 1A through 2C. Accordingly, the operation and details of many of the features of the voltage clamp 500 such as dielectric features, gate-to-source connection features, and/or so forth will not be described in connection with FIG. 4.

Figure 5:
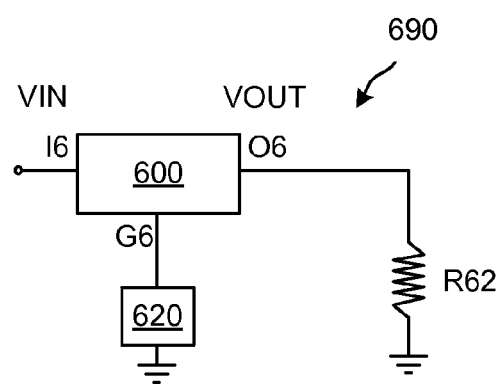
FIGS. 5 through 6B are diagrams that illustrate a circuit including a voltage clamp, and variations thereof.
Figure 6A:
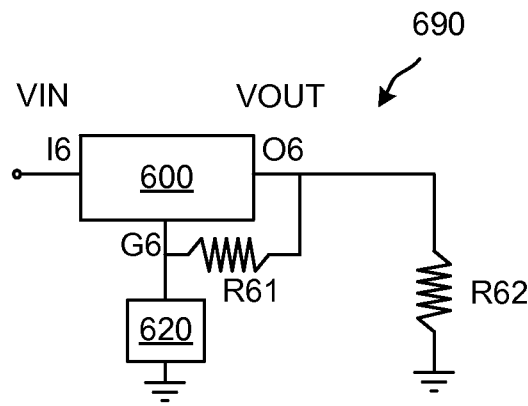
Figure 6B:
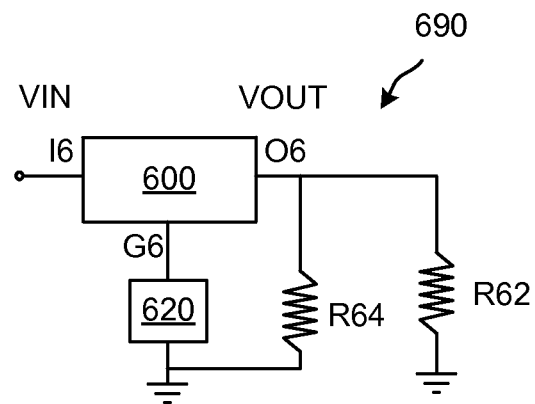

FIGS. 5 through 6B are diagrams that illustrate a circuit 690 including a voltage clamp 600, and variations thereof, according to an implementation. The voltage clamp 600 can be a variation of the voltage clamp 100 described in connection with at least FIGS. 1A and 1B. In accordance with the implementations described herein, the voltage clamp 600 includes a gate terminal G6 isolated from (e.g., electrically isolated from within the semiconductor die) an input terminal I6 (or drain terminal) and an output terminal O6 (or source terminal). In some implementations, the terminals can be referred to as nodes. A voltage at the input terminal I6 can be referred to as an input voltage (VIN) and a voltage at the output terminal O6 can be referred to as an output voltage (VOUT). As shown in FIG. 5, a load R62 is coupled to, or included within, the circuit 690.

In this implementation, the circuit 690 includes a voltage reference device 620 between the gate terminal G6 and a ground GND. In some implementations, the voltage reference device 620 can be a Zener diode, a shunt regulator, one or more diodes (e.g., a set of stacked diodes), a battery, a traditional regulator, and/or another type of voltage reference. The voltage reference device 620 can be configured to provide a constant (e.g., substantially constant) reference voltage (VREF), which can also be referred to as a reference clamping voltage. In some implementations, a voltage applied to the gate terminal G6 can be referred to as a gate voltage (VG).

The voltage clamp 600 has a limit initiating voltage between the output terminal O6 and the gate terminal G6. The voltage between the output terminal O6 and the gate terminal G6 can be referred to as the gate-to-source voltage (VGS). Because the voltage clamp 600 is a normally-on, or default on, device, the voltage clamp 600 begins to limit current when the absolute value of VGS is greater than the absolute value of the limit initiating voltage. In some implementations, the limit initiating voltage of the voltage clamp 600 can be 0.5 V or less, and the transition from a conducting state to a current-limiting state (in response to exceeding the limit initiating voltage) can occur on the order of a few nanoseconds (ns). The voltage clamp 600 has a current limit value that can be referred to as a native current limit or native current limit value when VGS=0. The voltage clamp 600 can be referred to as entering into an LDO mode when VGS<0 or when the output voltage VOUT is greater than the reference voltage VREF.

The clamping voltage of the voltage clamp 600 can be a voltage at which the voltage clamp 600 begins to limit current through the voltage clamp 600 and can be a voltage at which the output voltage VOUT is clamped. In some implementations, a clamping voltage can be approximately equal to a reference voltage of the voltage reference device 620 plus the limit initiating voltage (at a specified load current) of the voltage clamp 600. Because the reference voltage of the voltage reference device 620 and the limit initiating voltage are constant (or substantially constant), as the output voltage VOUT at the source terminal O6 rises beyond the clamping voltage, the resistance of the voltage clamp 600 can begin to rise (e.g., rise exponentially) and can limit current through the voltage clamp 600 and the output voltage VOUT to the clamping voltage.

In a variation on the circuit 690 shown in FIG. 5, the circuit 690 in FIG. 6A includes a gate pull-up resistor R61. The gate pull-up resistor R61 can be included to prevent the voltage reference device 620 from leaking and shorting to (or toward), for example, a ground potential. This can result in, for example, an undesirable drop of a voltage reference produced by the voltage reference device. In implementations where the voltage reference device 620 is an active reference with, for example, a current source and sync capability (shown in, for example, FIG. 6B), the pull-up resistor R61 may be optionally excluded from the circuit 690.

In some implementations, if the limit initiating voltage of the voltage clamp 600 is approximately 0.5 V and reference voltage of the voltage reference device 620 is approximately 5 V, the approximate worst case clamping voltage of the circuit 690 (or the clamped output voltage VOUT) will be approximately 5.5 V. If voltage reference device 620 is a clamping voltage reference, then even when the input voltage VIN is below 5.0 V, the current through the voltage clamp 600 will be at a native current limit of the voltage clamp 600 (or current limit when VGS=0).

As shown in FIG. 6B, a bypass resistor R64 (also can be referred to as a bypass current sync resistor) is in parallel to the voltage reference device 620. The bypass resistor R64 can be configured to improve the overall accuracy of the circuit 690. The bypass resistor R64 can be configured to increase a minimum current because the higher the minimum load current, or the closer the minimum current is to the maximum current, the better the tolerance of the circuit 690.

In some implementations, the voltage reference device 620 can be a voltage source. In such implementations, the voltage source can be used to reduce operating resistance of the voltage clamp 600 and/or can be used to increase a current limit of the voltage clamp 690 when operating below the voltage clamping region.

In some implementations, the components included in the circuit 690 (and variations thereof described herein) can be integrated into a single semiconductor die. In some implementations, one or more of the components included in the circuit 690 (and variations thereof described herein) can be discrete components coupled together via electrical connections (e.g., wires, traces, and/or so forth).

Figure 7:
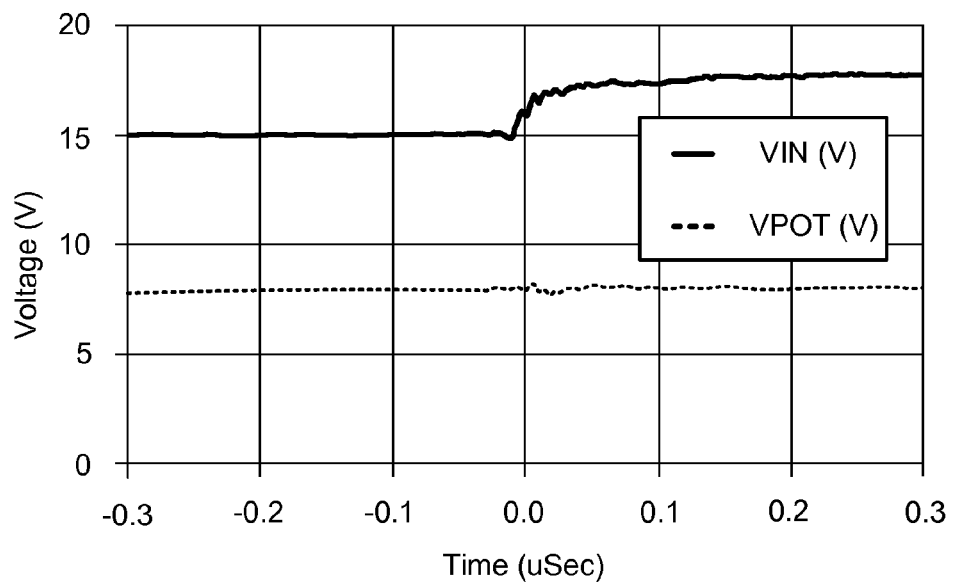
FIG. 7 is a graph that illustrates operation of the circuit shown in FIGS. 5 through 6B.

FIG. 7 is a graph that illustrates operation of the circuit 690 shown in FIG. 6A. In some implementations, FIG. 7 can be a graph with a Zener diode as referenced in FIG. 6A. The graph illustrates surge suppression capabilities of at least the circuit 690 and the circuit limiter 600. As shown in FIG. 7, in response to a step in the input voltage VIN from 15 V to 18 V the output voltage VOUT is constant or stable at approximately 8 V. In this example, the step occurs with a 30 ns rise time and an output capacitance of 1 microfarad (µF). FIG. 7 illustrates the relatively fast response time of the circuit 690 and the ability of the circuit 690 to clamp the output voltage VOUT in response to changes in input voltage VIN. The graph in FIG. 7 is presented by way of example only, and the response times of variations of the circuit 690 can be less than 30 ns, or greater than 30 ns in response to voltage steps greater than 3 V or less than 3 V. In addition, variations of the circuit 690 can be configured to clamp at voltages less than 8 V or greater than 8 V. Of note, and in contrast to a traditional LDO solution, is the fact that no intentional output capacitance was implemented in the circuit to achieve these results.

Figure 8:
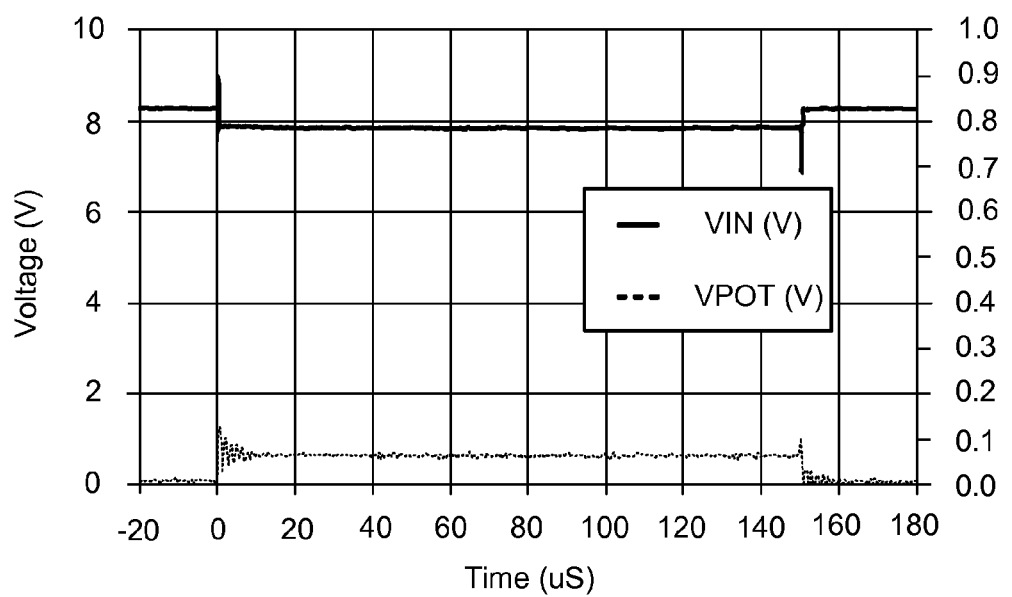
FIG. 8 is a graph that illustrates operation of the circuit shown in FIGS. 5 through 6B in response to a load step.

FIG. 8 is a graph that illustrates operation of the circuit 690 shown in FIG. 6A in response to a load step. In some implementations, FIG. 8 can be a graph with a Zener diode as reference in FIG. 6A. In this implementation, the circuit 690 does not include a load capacitor. In this example, the current through the load (shown as IOut) is changed from 0 A to 55 mA. In response to this load current change, the output voltage VOUT decreases less than a 1 V from approximately 8.5 V to approximately 8 V. As shown in FIG. 8, the transition occurs on the order a few nanoseconds. The graph in FIG. 8 is presented by way of example only, and variations of the circuit 690 can be configured to clamp at voltages less than 8 V or greater than 8 V in response to changes in load current.

Figure 9:
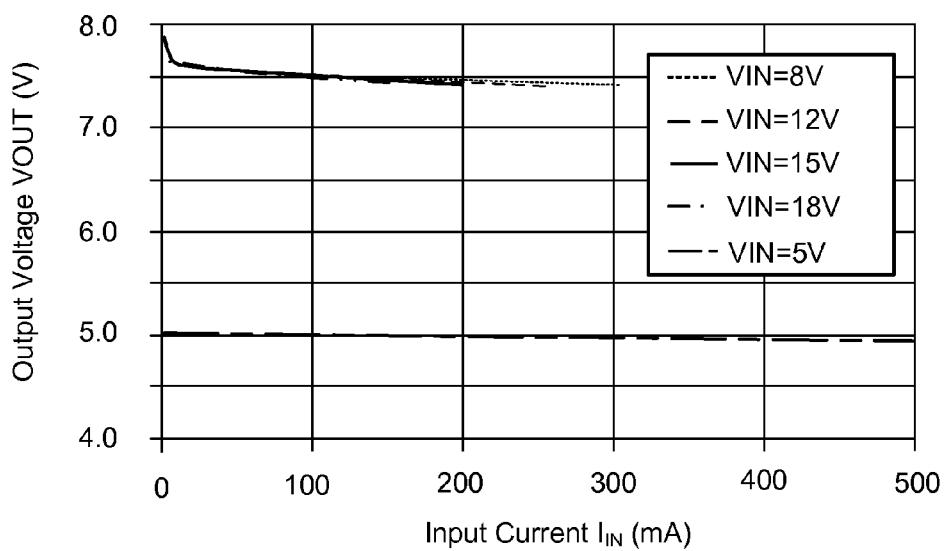
FIG. 9 is a graph that illustrates static load regulation of a circuit including a voltage clamp.

FIG. 9 is a graph that illustrates static load regulation of a circuit including a voltage clamp (i.e., FIG. 6A). FIG. 9 illustrates input current ($I_{IN}$) on the x-axis and output voltage VO on the y-axis. In some implementations, the graph shown in FIG. 9 can be viewed as a graph of maximum clamping voltage versus leakage current through resistor R62+R61. FIG. 9 illustrates that over a relatively wide range of input currents, the output voltage is clamped at approximately 7.5 V for a range of input voltage VIN between 8 V to 18 V. At the input voltage VIN of approximately 5 V, the output voltage VO is approximately 5 V because the voltage clamp is a normally-on device that has not yet reached the clamping voltage. In some implementations, the x-axis can represent an input current, which can, at least in part, flow into R61 leakage and a Load current. In some implementations, if output accuracy is needed at relatively low load currents, leakage through R61 can be increased to assure input current is maintained above a desired regulation point.

By holding a gate voltage (VG) of the voltage clamp at a specified level (using a voltage reference device (e.g., voltage reference device 620 shown in FIGS. 6A and 6B)), as soon as the output voltage VOUT begins to drift above the gate voltage, a channel (or space charge region) of the voltage clamps starts to pinch off and the current limit of the voltage clamp is reduced to clamp the output voltage VOUT. Accordingly, the gate voltage can be used to change and regulate the current limit of a voltage clamp.

Figure 10:
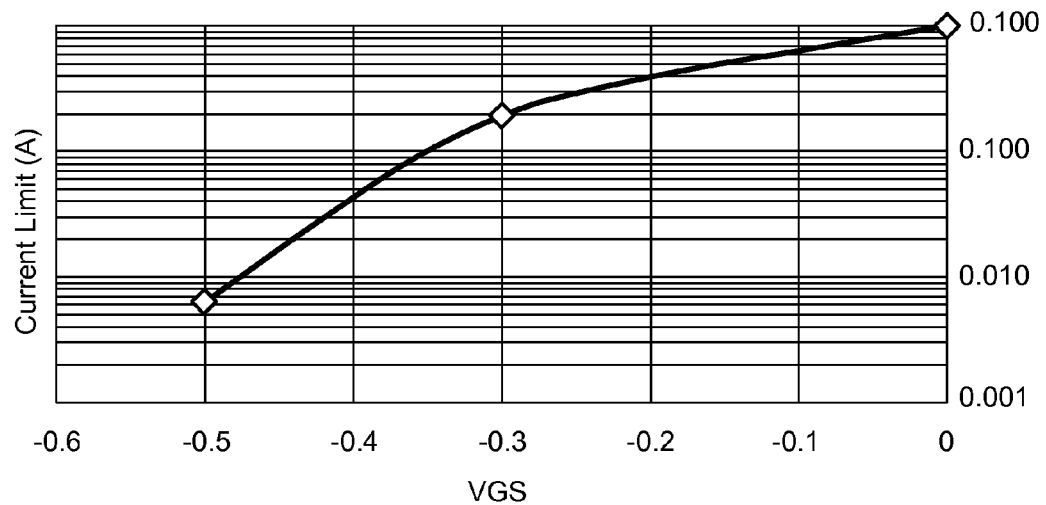
FIG. 10 is a graph that illustrates normalized current limit operation of a voltage clamp in response to gate-to-source voltage (VGS).

FIG. 10 is a graph that illustrates normalized current limit operation (on a log scale) of a voltage clamp in response to gate-to-source voltage (VGS). As mentioned above, the current limiting starts at the native current limit at approximately VGS=0. As shown in FIG. 10, the current limit increases sharply in response to a more positive VGS. FIG. 10 illustrates that the current limit level is highly sensitive to gate voltage. In other words, a relatively minimal VGS is required to turn off the gate of the voltage clamps described herein. It should be noted, that increasing the slope of this curve (or reducing the VGS associated with a specified current limit) can improve the accuracy versus load current of the LDO.

Figure 11:
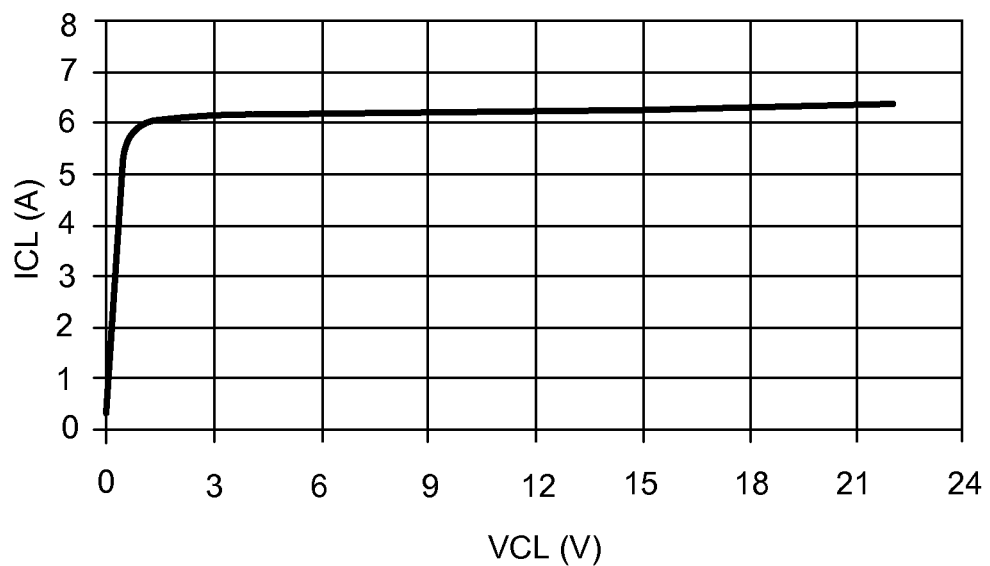
FIG. 11 is a graph that illustrates a current limit values versus clamping voltage for a voltage clamp.

FIG. 11 is a graph that illustrates a current limit values (ICL) versus clamping voltage (VCL) for a voltage clamp. The relatively flat to upward sloping current limiting versus voltage at specified VGS values of the voltage clamps described herein and as shown in FIG. 11 can be used to ensure operating stability of circuits including the voltage clamps.

Figure 12:
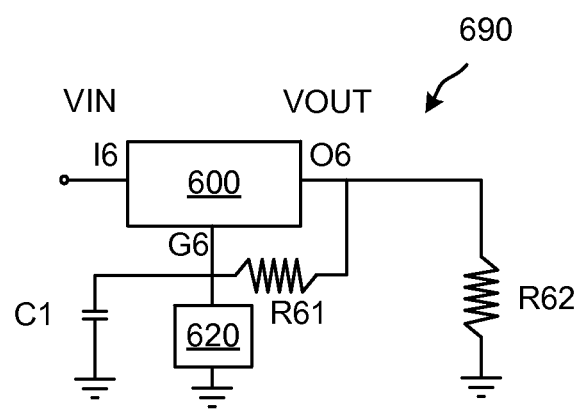
FIG. 12 is a diagram that illustrates a variation of the circuit shown in FIG. 6A.

FIG. 12 is a diagram that illustrates a variation of the circuit 690 shown in FIG. 6A. As shown in FIG. 12, a capacitor C1 is coupled to the gate terminal G6. The capacitor C1 from the gate terminal G6 to GND can be configured to compensate for drain-to-gate and/or source-to-gate capacitance impact on the reference voltage device 620, thereby stabilizing reference variation during large swings in drain or source voltage. In some implementations, the capacitor C1 can decrease noise (e.g., deglitch noise). In some implementations, the capacitor C1 can be a discrete capacitor, or can be a capacitance (e.g., a parasitic capacitance) incorporated within the reference voltage device 620.

In some implementations, the combination of the capacitor C1 and the resistor R61 can create slew rate control. For example, if an input voltage at VIN is stepped to a voltage, VOUT will increase as permitted by, the rise time of C1. As VOUT increases, capacitance C1 can permit an increase in the voltage at gate terminal G6 based on the RC time constant of the combination of capacitance C1 and resistor R61. Accordingly, if VOUT is increasing faster than the capacitance C1 (or RC time constant) allows, VGS beings to drop, and the current limit is reduced to decrease the rate of rise of VOUT.

Figure 13:
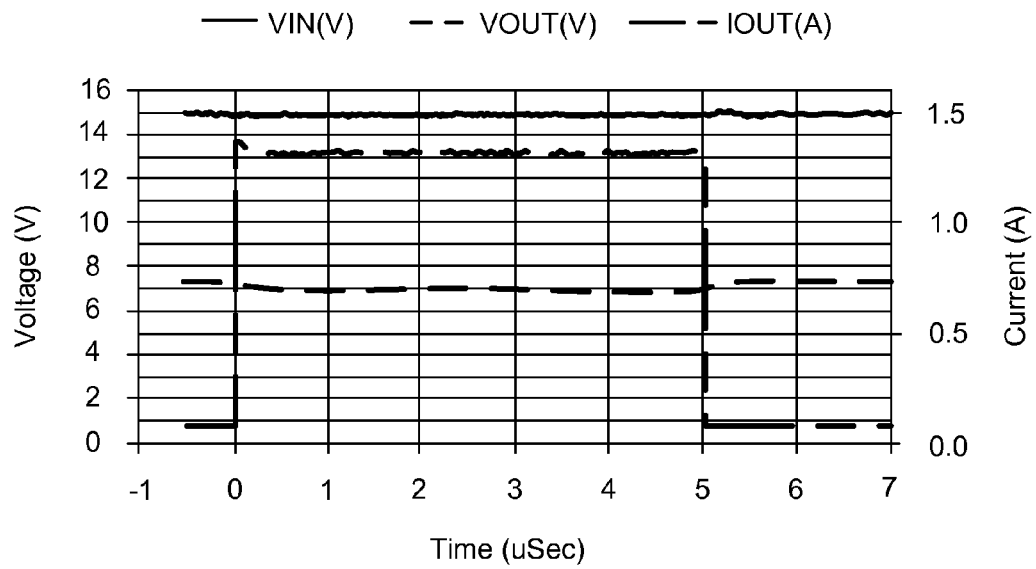
FIG. 13 is a graph that illustrates operation of the circuit shown in FIG. 12 in response to a load step.

FIG. 13 is a graph that illustrates operation of the circuit 690 shown in FIG. 12 in response to a load step from 70 mA to 1.3 A. In this implementation, the pulse time is approximately 5 µs. The input voltage VIN is approximately 15 V, the capacitor C1 has a capacitance of approximately 1 µF, and the output capacitance is approximately 1 µF. In response to load step from 70 mA 1.3 A, the output voltage VOUT is relatively constant. Response time of the circuit is in the nanosecond range. No significant glitches or surges in output voltage are visible. This graph is presented by way of example only, and the parameters such as load step, input voltage VIN, capacitances, and so forth can be different in some implementations.

Figure 14:
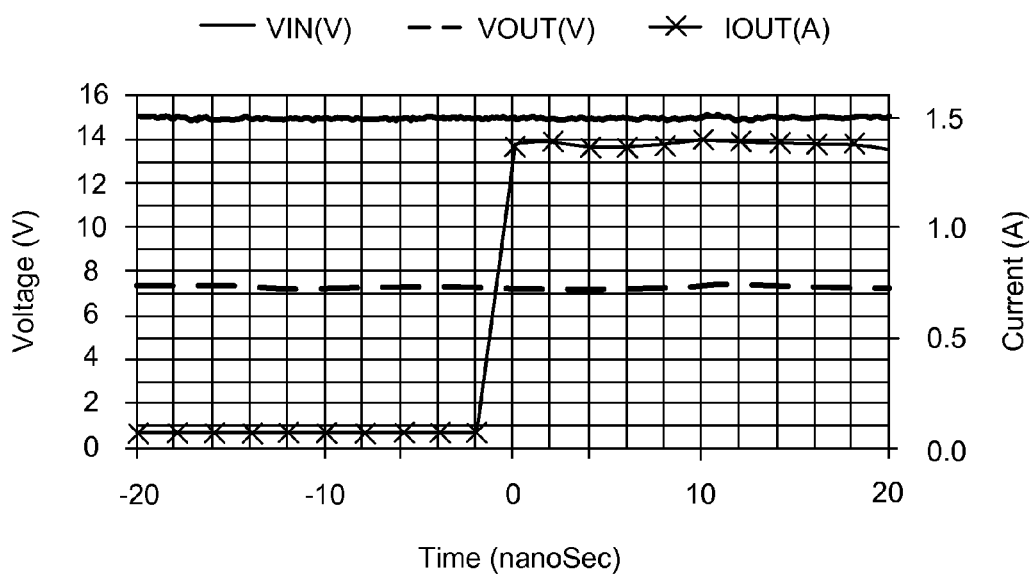
FIG. 14 is a graph that illustrates operation of the circuit shown in FIG. 12 in response to a regulated load step.

FIG. 14 is a zoom in of graph 13, and further illustrates operation speed and stability of the circuit 690 shown in FIG. 12 in response to a regulated load step from 70 mA to 1.3 A. In this implementation, the rise time of the load current is approximately 2 ns. The input voltage VIN is approximately 15 V, the capacitor C1 has a capacitance of approximately 1 µF, and the output capacitance is approximately 1 µF. In response to regulated load step from 70 mA 1.3 A, the output voltage VOUT is relatively constant. This graph is presented by way of example only, and the parameters such as load step, input voltage VIN, capacitances, and so forth can be different in some implementations.

Figure 15:
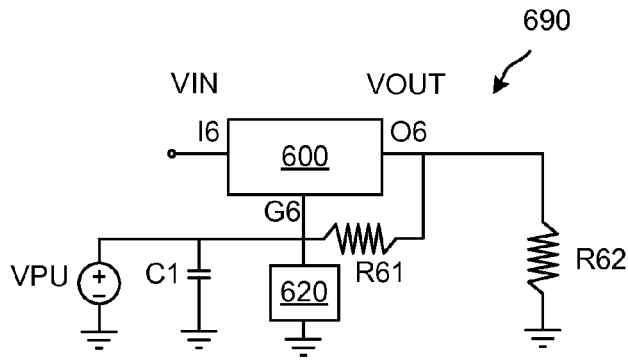
FIG. 15 is a diagram that illustrates a variation of the circuit shown in FIG. 6A.

FIG. 15 is a diagram that illustrates a variation of the circuit 690 shown in FIG. 6A. As shown in FIG. 15, a capacitor C1 and a voltage source VPU are coupled to the gate terminal G6. The capacitor C1 from the gate terminal G6 to GND can be configured to compensate for drain-to-gate and/or source-to-gate capacitance impact on the reference voltage produced by the reference voltage device 620.

The voltage source VPU can be configured to support a reduced drain-to-source resistance (RDS) mode when the input voltage VIN is less than a voltage of the voltage source VPU. In some implementations, the voltage source VPU can be referred to as a pull-up voltage source. Although not shown, in some implementations, the voltage source VPU can be used in place of or in conjunction with a voltage reference device 620. In such implementations, the voltage of the voltage source VPU can be below a reference voltage of the voltage reference device 620 and/or voltage reference device 620 can function as a current sink. In some implementations, the voltage reference device 620 and/or the resistance R61 can be a discrete device, or can be integrated into the voltage clamp 600 using, for example, polysilicon diodes, on-chip resistor technology, and are so forth. Some voltage sources may not sink current in a desirable fashion, and the voltage reference device 620 can ensure voltage clamping under many different conditions.

Figure 16:
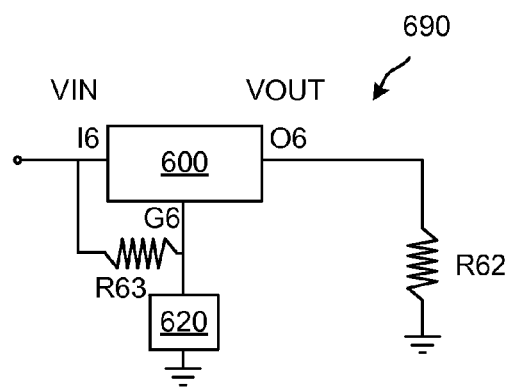
FIG. 16 is a diagram that illustrates another variation of the circuit shown in FIG. 6A.

FIG. 16 is a diagram that illustrates another variation of the circuit 690 shown in FIG. 6A. As shown in FIG. 16, a resistor R63 is coupled between the input terminal I6 and the gate terminal G6. The resistor R61 is not shown, but can be included or excluded from this implementation depending on the exact system characteristics. The addition of resistor R63 can be used to reduce operating resistance at input voltages below the clamping voltage of a clamping reference voltage implementation of 620. Specifically, the resistor R63 (which can be a pull-up resistor to the input voltage VIN) can be used to reduce in-rush resistance and/or operating resistance of the circuit 690. This can be achieved by pulling the gate voltage VG above the source voltage VS (e.g., voltage at the output terminal O6). Accordingly, the current limit point of the voltage clamp 600 can be increased (the current limit when VGS=0 can be the current limit point). In operation, if the reference voltage (VREF) produced by the reference voltage device 620 begins to clamp (i.e., as the output voltage VOUT approaches and/or exceeds the reference voltage VREF), the output voltage VOUT is limited by the reference voltage (VREF) and the current limit values associated with VGS. In some implementations, increasing the gate to drain voltage can cause VGS to increase to VGS>0, and raise the current limit of the voltage clamp 600 (and reduce RDS of the voltage clamp 600 when in the non-limiting state). In some implementations, if the native point of a current limit is when VGS=0, then pulling up the gate voltage to the drain voltage, will make VGS>0, and will raise the current limit of the device (and reduce RDS in the non-limiting operational mode).

Figure 17:
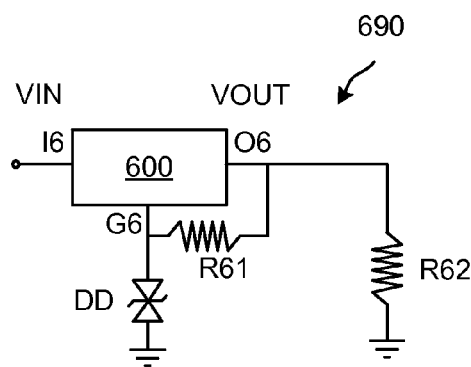
FIG. 17 is a diagram that illustrates yet another variation of the circuit shown in FIG. 6A that includes reverse polarity hardening.

FIG. 17 is a diagram that illustrates yet another variation of the circuit 690 shown in FIG. 6A that includes reverse polarity hardening. As shown in FIG. 17, back-to-back diodes DD are included in the circuit 690 as the reference voltage device 620. In this implementation, when the gate voltage VG is greater than the source voltage VS, the voltage clamp 600 will conduct between the input terminal I6 and the output terminal O6 in a low resistance state and current can flow in either direction (between the input terminal I6 and the output terminal O6). In some implementations, VGS (when the gate voltage VG is greater than the source voltage VS) can be limited by gate dielectric (e.g., dielectric 160 shown in FIG. 1) breakdown values. Applying a bidirectional voltage clamp on the reference voltage VREF using the back-to-back diodes DD, can be used to increase the effective reverse polarity voltage that can be handled by the voltage clamp 600.

In some implementations, the value of resistors (e.g., the resistor R61, the resistor R63) described above in several of the implementations can be varied to improve the accuracy of the turn-off of the voltage clamps 600 and/or to reduce leakage current through the voltage clamp 600. The resistors (e.g., resistor R61 in circuit 690) can impact leakage during voltage clamping or LDO mode (i.e., when the output voltage VOUT is greater than the reference voltage VREF). In some implementations, as the value of at least one of the resistors is increased, leakage current during output voltage clamping can be reduced. In some implementations, as the value of at least one of the resistors is reduced, leakage current increases, and zero load max clamping voltage can be reduced. In some implementations, the value of at least one of the resistors can be configured so that the at least one resistor can function as a load (e.g., a minimum load) to dictate a gate swing (e.g., a maximum gate swing) to turn-off current to a load (e.g., resistor R62 shown in FIG. 6A).

The voltage clamps described herein have many advantages over traditional low drop-out (LDO) regulator structures which can be relatively slow, can have a high series resistance with large drop out, are prone to oscillations and instability, and/or so forth. Also because traditional regulator structures include PN junctions, the safe operating area (SOA) can be relatively narrow compared with the voltage clamps described herein. In addition, the transition speeds of the traditional LDO regulators can be slow compared with the voltage clamps described herein, due to the PN junctions and response times of the control circuits. Finally, the cost of producing traditional low drop-out regulators can be many times more expensive than the cost of production of the voltage clamps described herein.

An alternate "always on" LDO approach would be to use a a traditional depletion mode MOSFET device in place of the gate controlled voltage clamp described herein. However these junction-based devices can have a threshold voltage as high as 3V, which has historically made the device impractical for normal regulation and can result in the need for a second stage. Furthermore, the depletion mode MOSFET approach includes a slow acting PN Junction design, and a negative temperature coefficient (NTC) threshold voltage that is subject to faster damage and a relatively undesirable SOA.

Although the behavior of the circuits shown and described in the graphs herein as making transitions at specified voltages and at specified times, when implemented, the transitions of components may occur slightly before or slightly after the specified voltages, specified times, and/or so forth. Specifically, variations in limit initiating voltages, processing variations, temperature variations, switching speeds of devices, circuit transition delays, and/or so forth can result in conditions (e.g., non-ideal conditions) that can trigger transitions of components slightly before or slightly after the specified voltages, times, and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a voltage reference device; and
a junction-less, gate-controlled voltage clamp device configured to limit a current and having a gate terminal coupled to the voltage reference device, the voltage clamp device including a source conductor, the voltage clamp device being biased to a normally on-state, the voltage clamp device configured to change from being in the normally on-state to a current limiting state when a difference in potential between the gate terminal and the source conductor increases, the junction-less, gate-controlled voltage clamp device including:
a semiconductor substrate,
a trench defined within the semiconductor substrate, the trench having a sidewall and a bottom, and
a dielectric disposed within the trench,
the semiconductor substrate having a conductivity type that is the same along the sidewall of the trench and along the bottom of the trench.

2. The apparatus of claim 1, wherein the junction-less, gate-controlled voltage clamp device excludes a junction of two different conductivity type materials in a primary current path.

3. The apparatus of claim 1, further comprising:
a resistor, the gate terminal being coupled to the resistor.

4. The apparatus of claim 1, wherein
the trench has a depth aligned along a vertical axis, a length aligned along a longitudinal axis, and a width aligned along a horizontal axis,
the junction-less, gate-controlled voltage clamp device further including:
a gate electrode associated with the gate terminal and disposed within the dielectric, the gate electrode having at least a portion insulated from the semiconductor substrate by the dielectric.

5. The apparatus of claim 4, wherein the semiconductor substrate has a portion aligned vertically and adjacent the trench, the portion of the semiconductor substrate has the conductivity type and is continuous along an entirety of the depth of the trench.

6. The apparatus of claim 4, wherein the portion of the semiconductor substrate is a first portion of a mesa, the mesa includes a source region.

7. The apparatus of claim 4, the junction-less, gate-controlled voltage clamp device further includes:
the source conductor disposed on a first side of the semiconductor substrate; and
a drain conductor disposed on a second side of the semiconductor substrate opposite the first side of the semiconductor substrate.

8. The apparatus of claim 4, the junction-less, gate-controlled voltage clamp device further includes:
the source conductor disposed on a first side of the semiconductor substrate; and
a drain conductor disposed on a second side of the semiconductor substrate opposite the first side of the semiconductor substrate,
the portion of the semiconductor substrate having the conductivity type and extending between the source conductor and the drain conductor.

9. The apparatus of claim 4, the junction-less, gate-controlled voltage clamp device further includes:
the source conductor disposed on a top surface of the semiconductor substrate, the dielectric having a portion disposed between the source conductor and the gate electrode.

10. The apparatus of claim 4, the junction-less, gate controlled voltage clamp device further includes:
the source conductor disposed on a top surface of the semiconductor substrate, the dielectric having a portion coupled to the source conductor and coupled to the gate electrode.

11. The apparatus of claim 8, wherein the conductivity type is an N-type conductivity, the gate electrode has the N-type conductivity.

12. The apparatus of claim 4, wherein the portion of the semiconductor substrate is a first portion of the semiconductor substrate,
the junction-less, gate-controlled voltage clamp device further includes:
the source conductor disposed on a first side of the semiconductor substrate and coupled to a first portion of the dielectric; and
a drain conductor disposed on a second side of the semiconductor substrate opposite the first side of the semiconductor substrate, the drain conductor being separated from a second portion of the dielectric by a second portion of the semiconductor substrate.

13. The apparatus of claim 4, wherein the dielectric has a first portion aligned vertically and a second portion aligned horizontally,
the apparatus further comprising:
a first space charge region of the conductivity type in contact with the first portion; and
a second space charge region of the conductivity type in contact with the second portion.

14. The apparatus of claim 4, wherein the apparatus is configured to limit current to a saturation current in response to voltage drop across the semiconductor substrate.

15. An apparatus, comprising:
a semiconductor substrate;
a trench defined within the semiconductor substrate and having a depth aligned along a vertical axis, a length aligned along a longitudinal axis, and a width aligned along a horizontal axis;
a dielectric disposed within the trench; and
a gate electrode disposed within the dielectric and insulated from the semiconductor substrate by the dielectric,
the semiconductor substrate having a first portion aligned vertically and adjacent a sidewall of the trench, the portion of the semiconductor substrate having a conductivity type that is continuous along an entirety of the depth of the trench and excludes a junction of two different conductivity type materials in a primary current path,
the semiconductor substrate having a second portion along a bottom of the trench, the second portion having the conductivity type,
the apparatus being biased to a normally on-state, the apparatus being configured to change from the normally on-state to a current limiting state when a difference in potential between the gate electrode and a source terminal increases.

16. The apparatus of claim 15, wherein the apparatus excludes the junction of two different conductivity type materials in a primary conduction path, the primary conduction path is along substantially an entirety of a space charge region and substantially an entirety of a drift region.

17. The apparatus of claim 15, wherein the apparatus defines a junction-less, gate-controlled voltage clamp device.

18. The apparatus of claim 15, wherein the apparatus is configured to limit current to a saturation current in response to voltage drop across the semiconductor substrate.

19. The apparatus of claim 1, wherein the junction-less, gate-controlled voltage clamp device is in the normally on-state when a difference in potential between the gate terminal and the source conductor is zero.

* * * * *